(12) United States Patent
Meier et al.

(10) Patent No.: US 7,679,886 B2
(45) Date of Patent: Mar. 16, 2010

(54) ENGINE CONTROL DEVICE

(75) Inventors: Markus Meier, Rieden (DE); Norbert Reichenbach, Amberg (DE); Fritz Royer, Hahnbach (DE)

(73) Assignee: Siemens Aktiengesellschaft, Munich (DE)

( * ) Notice: Subject to any disclaimer, the term of this patent is extended or adjusted under 35 U.S.C. 154(b) by 462 days.

(21) Appl. No.: 11/547,274

(22) PCT Filed: Mar. 16, 2005

(86) PCT No.: PCT/EP2005/051219

§ 371 (c)(1),
(2), (4) Date: Oct. 4, 2006

(87) PCT Pub. No.: WO2005/099330

PCT Pub. Date: Oct. 20, 2005

(65) Prior Publication Data

US 2007/0159861 A1   Jul. 12, 2007

(30) Foreign Application Priority Data

Apr. 5, 2004   (DE) .................. 10 2004 017 292

(51) Int. Cl.
H02B 1/26   (2006.01)
H02B 1/56   (2006.01)

(52) U.S. Cl. .............. 361/623; 361/620; 361/622; 361/676; 174/16.3; 174/520; 174/548

(58) Field of Classification Search ............... 361/622, 361/602, 641, 614, 620–621, 627–629, 631–632, 361/676–678, 688–690, 694–695, 697, 704; 174/16.3, 520, 547–548; 165/80.2–80.3, 165/185

See application file for complete search history.

(56) References Cited

U.S. PATENT DOCUMENTS

| 4,356,368 | A | * | 10/1982 | Osika .................. 200/307 |
| 4,434,390 | A | * | 2/1984 | Elms .................. 318/473 |
| 5,424,900 | A | * | 6/1995 | Kiiskinen et al. .......... 361/116 |
| 5,652,420 | A | * | 7/1997 | Innes et al. ............ 200/50.32 |
| 6,297,573 | B1 | * | 10/2001 | Roth-Stielow et al. .... 310/68 C |
| 6,317,348 | B1 | | 11/2001 | Vackar |
| 6,531,940 | B1 | * | 3/2003 | Busch .................. 335/132 |
| 6,856,503 | B2 | * | 2/2005 | Apfelbacher et al. ........ 361/676 |
| 6,891,725 | B2 | * | 5/2005 | Derksen .................. 361/704 |
| 6,900,562 | B2 | * | 5/2005 | Derksen .................. 310/68 R |
| 6,956,728 | B2 | * | 10/2005 | Zhou et al. .................. 361/160 |
| 7,149,064 | B2 | * | 12/2006 | Nolden et al. .................. 361/23 |
| 2003/0119382 | A1 | | 6/2003 | Narusevicius et al. |
| 2004/0056631 | A1 | | 3/2004 | Derksen |
| 2008/0180886 | A1 | * | 7/2008 | Dornauer et al. ............ 361/676 |

FOREIGN PATENT DOCUMENTS

| JP | 08093680 | 4/1996 |
| WO | WO-01/13506 | 2/2001 |
| WO | WO 01/86681 A1 * | 11/2001 |

* cited by examiner

*Primary Examiner*—Jayprakash N Gandhi
*Assistant Examiner*—Robert J Hoffberg
(74) *Attorney, Agent, or Firm*—Harness, Dickey & Pierce, P.L.C.

(57) ABSTRACT

An engine control device, especially an engine control device having an internal by-pass, is disclosed. The universally applicable engine control device includes an integrated by-pass function. For this purpose, a housing includes chambers that are electrically insulated from one another and that are configured both to receive a respective power subunit, and, alternatively, to receive a continuous current-bearing element.

20 Claims, 5 Drawing Sheets

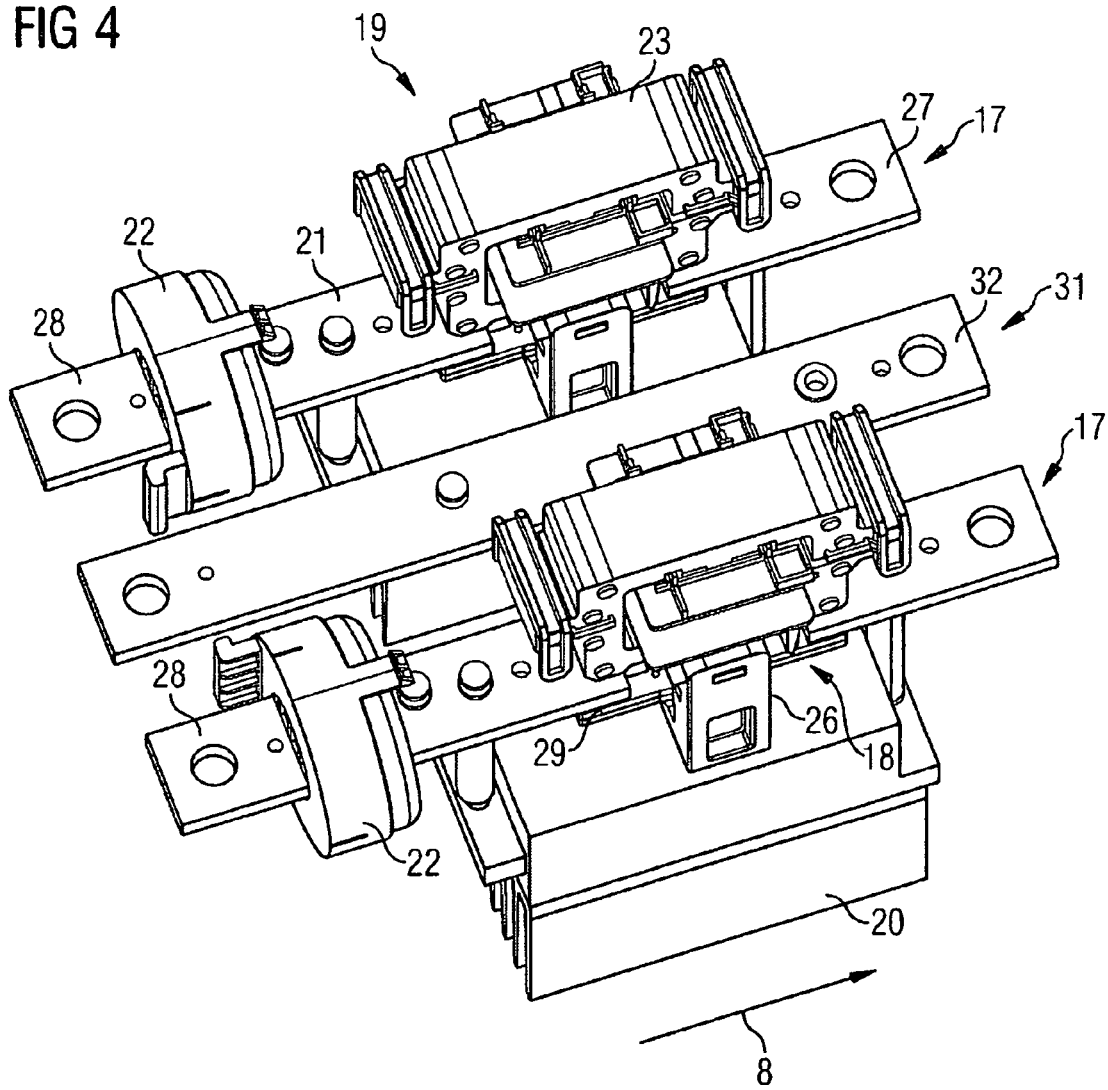

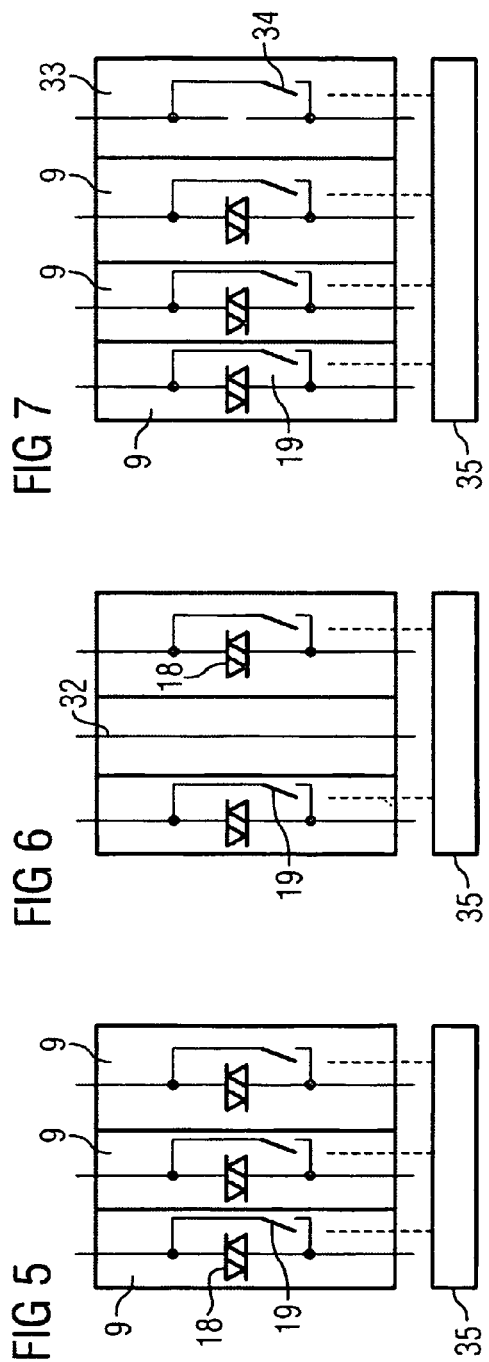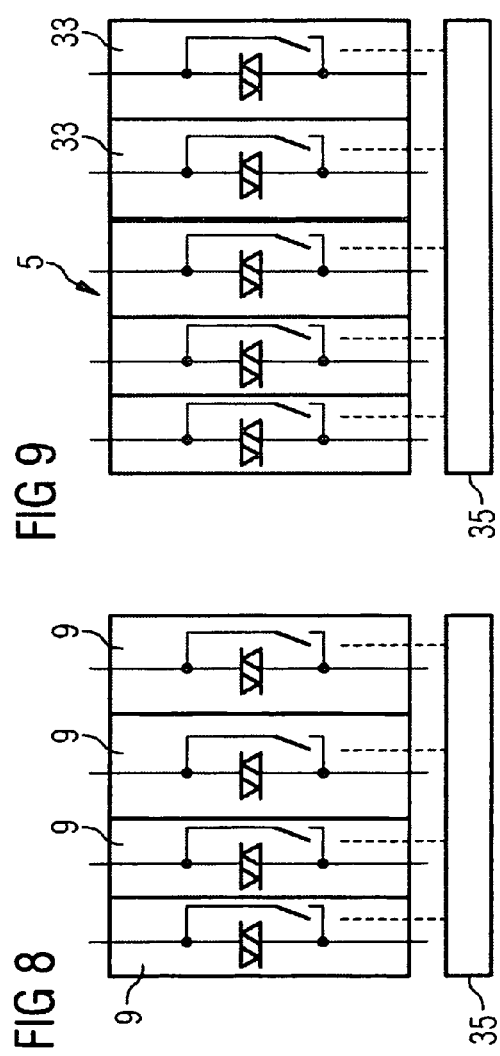

ENGINE CONTROL DEVICE

PRIORITY STATEMENT

This application is the national phase under 35 U.S.C. § 371 of PCT International Application No. PCT/EP2005/051219 which has an International filing date of Mar. 16, 2005, which designated the United States of America and which claims priority on German Patent Application number 10 2004 017 292.7 filed Apr. 5, 2004, the entire contents of which are hereby incorporated herein by reference.

FIELD

The invention generally relates to a motor control device, in particular to a motor control device with an internal bridge (bypass).

BACKGROUND

In semiconductor motor control devices (soft starters) known from the prior art, it is known to create a bypass function by use of an additional contactor. In this case, the soft starter takes over actuation of the contactor. One disadvantage of these devices is that additional components are required. The prior art also discloses devices in which the bypass function is integrated in the motor control device. However, one disadvantage of these devices is that they are formed either only for a two-phase controlled design or else only for a three-phase controlled design.

SUMMARY

In at least one embodiment of the present invention, a motor control device is provided with an integrated bypass function which can be used universally.

The central idea of at least one embodiment of the invention is to achieve universal usability by way of a novel housing design. To this end, provision is particularly made to provide a plurality of chambers, which are arranged such that they are insulated from one another, in the housing of the motor control device. These chambers are designed in such a way that they can each hold a power subunit.

At the same time, the design of the chambers also allows a continuous current-carrying element, instead of a power subunit, to be used to populate the chambers. It is therefore possible to permit a very wide variety of device functionalities using a single housing design with very little expenditure. This provides the user with solutions which are matched to the specific requirements of the respective application with the use of just one single design system in a quick and low-cost manner. Furthermore, the same testing and production techniques can be used in each case.

Advantageous embodiments include a central control unit which serves to actuate the individual power subunits separately. The arrangement of this control unit in the housing produces a motor control device which can be used for a very wide variety of applications. In particular, both a three-phase controlled and a two-phase controlled motor control device can be formed using a single housing type on account of the use of a corresponding control unit.

BRIEF DESCRIPTION OF THE DRAWINGS

The present invention is described below with reference to example embodiments which are explained in greater detail with the aid of drawings, in which:

FIG. 4 shows a perspective illustration of a switching module for forming a three-pole, two-phase controlled motor control device, FIG. 5 shows a schematic illustration of a three-phase controlled motor control device, FIG. 6 shows a schematic illustration of a two-phase controlled motor control device, FIG. 7 shows a schematic illustration of a four-pole, three-phase controlled engine control device with a fourth pole which can be disconnected separately, FIG. 8 shows a schematic illustration of a two-phase controlled reversing starter, and FIG. 9 shows a schematic illustration of a three-phase controlled reversing starter with poles which can be attached to the side.

DETAILED DESCRIPTION OF THE EXAMPLE EMBODIMENTS

Figure 1:
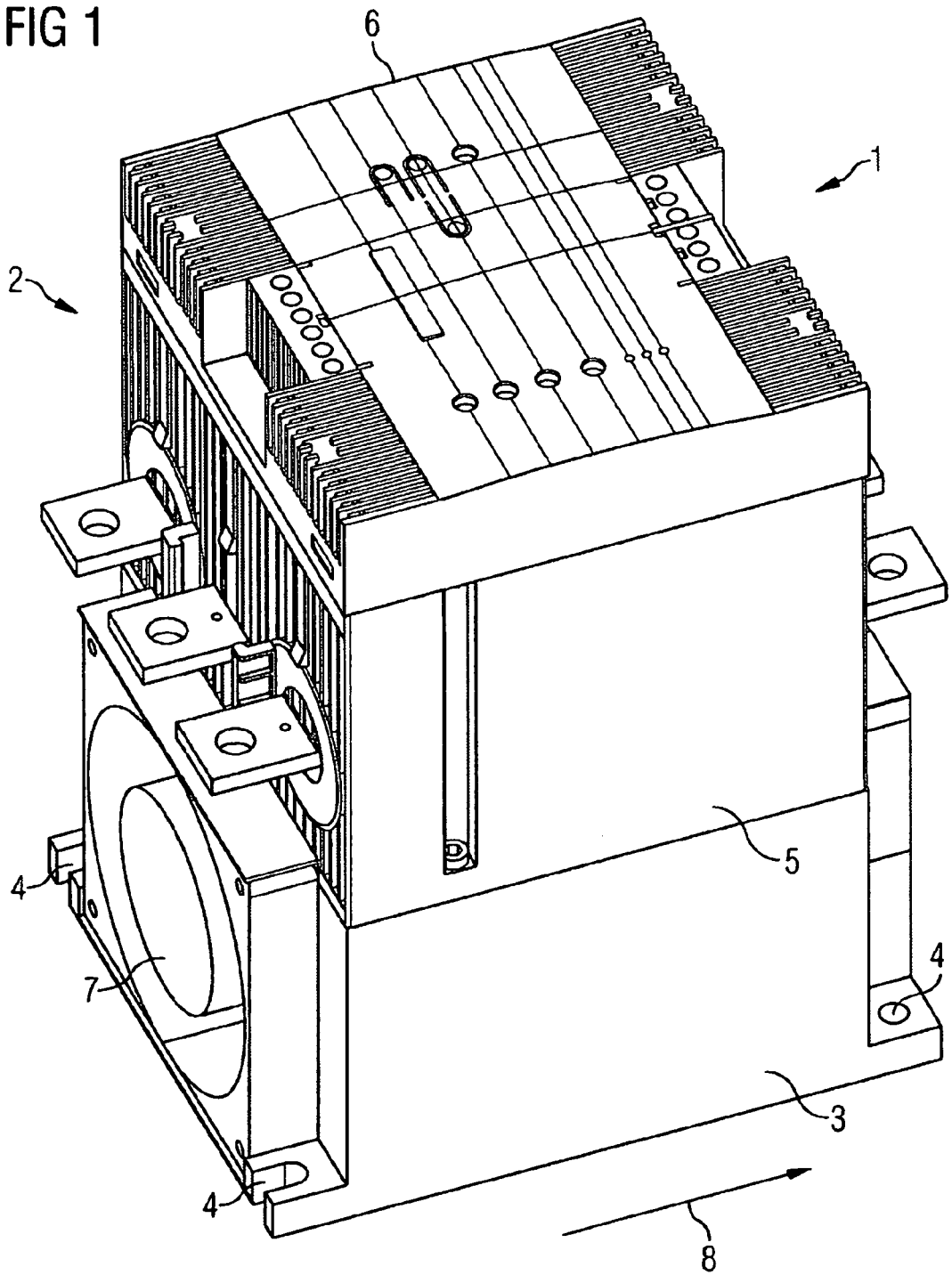
FIG. 1 shows a perspective illustration of a motor control device of three-pole design.

FIG. 1 shows a three-pole motor control device 1 which substantially includes a housing unit 2 and a cooling unit 3 which is arranged beneath the housing unit 2. The housing unit 2 is produced entirely from a plastics material. Fixing elements 4 for fixing the motor control device 1 to a mounting wall or the like are provided in the base region of the cooling unit 3.

The housing unit 2 includes a housing base module 5 and a housing cover 6 which is fitted on said housing base module and is formed to hold a central control unit (not depicted). The central control unit serves to actuate the individual power subunits of the motor control device 1.

The cooling unit 3 serves to hold heat sinks of the power subunits of the motor control device 1. Furthermore, fans 7 are provided for actively cooling the motor control device 1. However, it goes without saying that an embodiment without additional fans is also possible.

Figure 2:
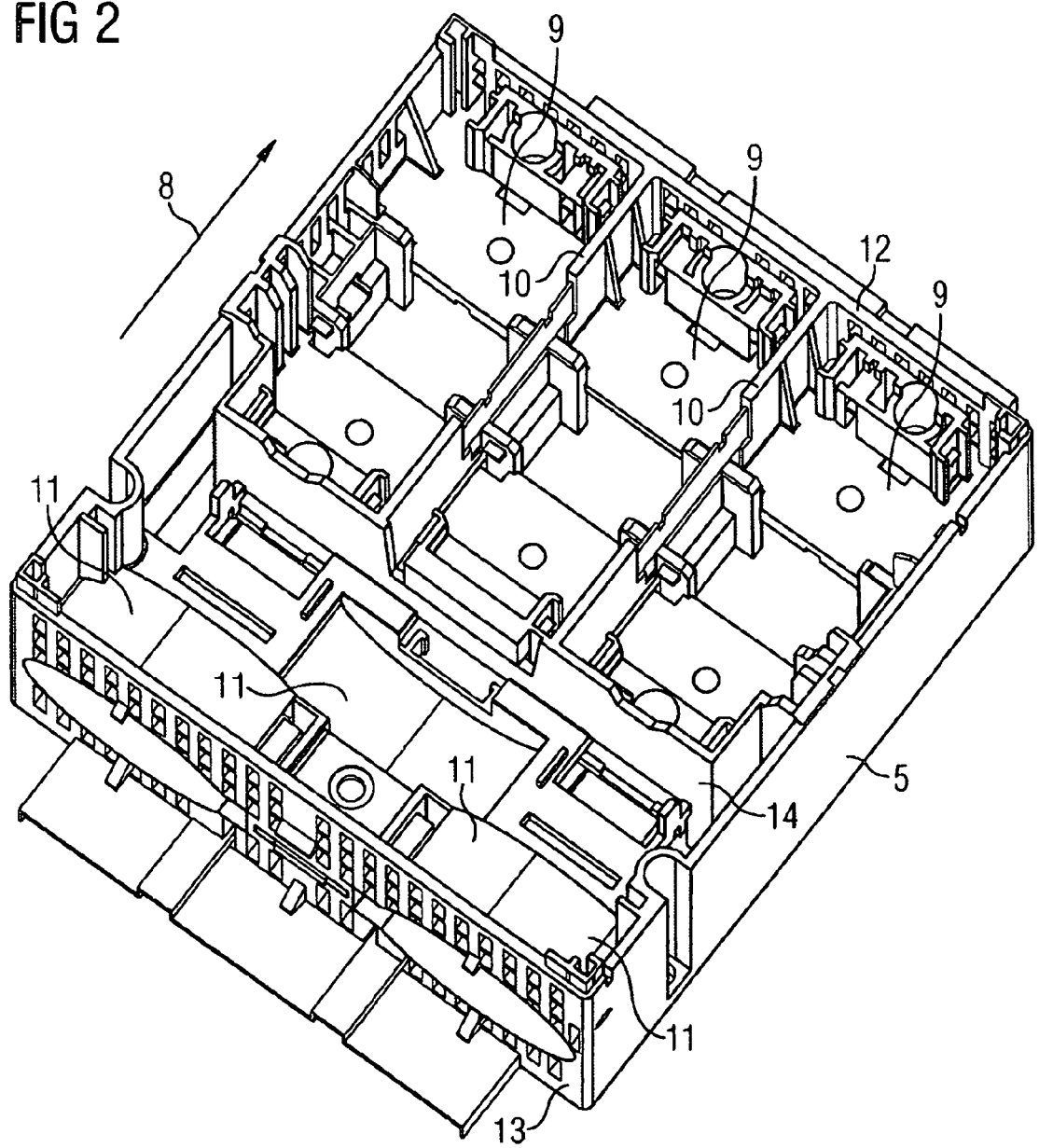
FIG. 2 shows a perspective illustration of a housing portion of the motor control device depicted in FIG. 1.

FIG. 2 shows a view of the housing base module 5 without the housing cover 6. The interior of the housing base module 5 is provided with three chambers 9 which run in the longitudinal direction 8 of the conductor and are structurally separated from one another by partition walls 10. Adequate electrical insulation between the chambers 9 on the one hand and the electrically conductive elements, in particular the power subunits, which can be installed in the chambers 9 on the other, is ensured on account of the housing material used.

Each of these chambers 9 serves to hold one phase of the motor control device 1. The present housing base module 5 is therefore suitable for forming a three-pole motor control device 1. Each chamber 9 has an associated housing recess 11 for holding a current transformer. In the illustrated exemplary embodiment, these housing recesses 11 are arranged outside the actual chambers 9. However, it is equally possible to extend the partition walls 10, which run parallel to the longitudinal direction 8 of the conductor, from the rear face 12 of the housing base module 5 toward its end face 13 in such a way that the housing base module 5 is completely divided into three chambers 9 without the use of transverse walls 14.

The chambers 9 are designed to hold power subunits or continuous current-carrying elements. To this end, they have bearing and retaining or support elements.

Figure 3:
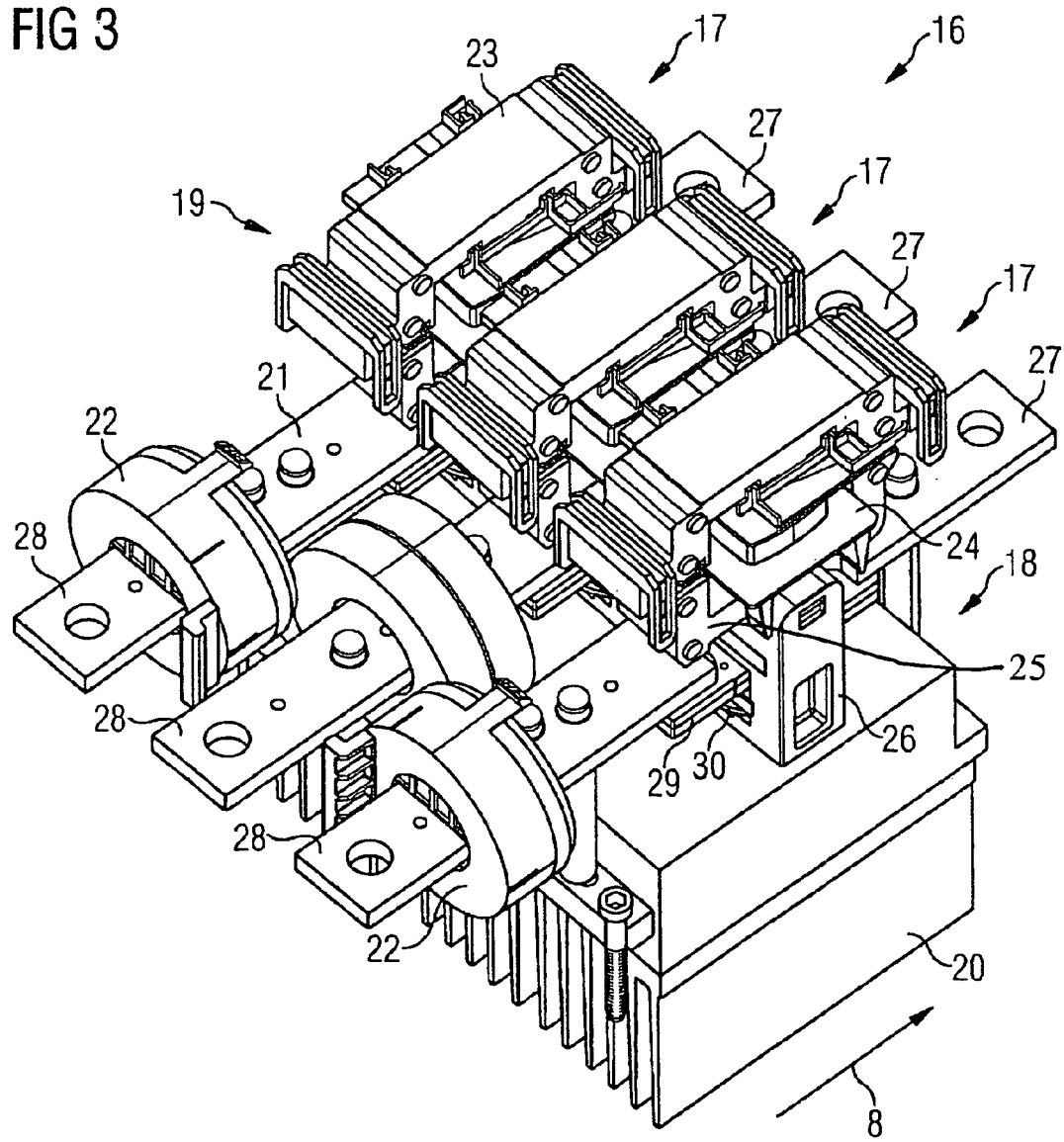
FIG. 3 shows a perspective illustration of a switching module for forming a three-pole, three-phase controlled motor control device.

FIG. 3 shows a switching module 16, as can be installed in a housing base module 5 which is illustrated in FIG. 2, for forming a three-pole, three-phase controlled motor control device 1. The figure depicts three power subunits 17, with each phase respectively having an associated power subunit 17. Each power subunit 17 includes an electronic switching element 18 in the form of a thyristor and an electromechanical bridge in the form of an electromechanical switching element 19 of the single-phase contactor type, and corresponding heat sinks 20. In other words, the electronic switching elements 18 each have an associated electromechanical switching element 19.

Each phase has an associated contact rail 21. In the final mounting state, these contact rails 21 in each case emerge from the housing base module 5 at the end face 13 and at the rear face 12 of the housing base module 5 in order to form connection contacts. Each contact rail 21 has an associated toroidal core transformer 22 which lies in a housing recess 11, supplies current information to the control unit and thus ensures that the motor is protected.

The central control unit, which is arranged in the housing cover 6 of the housing unit 3 and is in the form of a microcontroller which is arranged on a printed circuit board, serves for the phase angle-controlled triggering of the thyristors when the motor (not depicted) which is connected to the motor control device is ramped up and switched off.

After the motor which is actuated by the motor control device 1 is ramped up using the electronic switching element 18 and has reached its operating point, that is to say rated rotational speed and rated current, the bridging or bypass function is activated by the control unit. In other words, the electronic switching element 18 is bridged by the electromechanical switching element 19. If the motor is switched off again, the control unit deactivates the electromechanical switching element 19 and activates the electronic switching element 18. The motor is therefore switched on and off by way of the electronic switching element 18, whereas current is conducted by means of the electromechanical switching element 19. In this case, the control unit serves to control the interaction between thyristor and bridge.

At the same time, the control unit evaluates the current level information of the toroidal core transformers 22 which are associated with the individual phases and determines the loading of the thyristors for adequate self-protection by the thyristors. Furthermore, the control unit is responsible for protecting the motor.

Since the electromechanical switching element 19 exhibits a heat loss which is approximately ten times lower than that of the electronic switching element 18, in other words the heat losses produced during operation by means of the electromechanical switching element 19 are thus several times lower, the heat sinks 20 which are provided for cooling the electronic switching element 18 can be designed to be substantially smaller. Furthermore, the electronic switching element 18 itself can also be made smaller since it is not permanently subjected to loading.

The electromechanical switching element 19 includes a stationary yoke 23 which has a magnet coil 24 arranged beneath it. A mobile armature 25 is arranged beneath the coil 24. A plastic contact support 26 which is connected to the armature 25, two fixed contacts 27, 28, and a mobile switching piece 29, which is supported on the contact support 26 via a spring 30, form the connecting part.

The fixed contacts 27, 28, which are in the form of contact rails 21 and are provided for connecting connection cables, have silver layers. If a voltage is applied to the switching element 19 by way of the control unit, current flows through the magnet coil 24 and the armature 25 moves in the direction of the yoke 23 until the armature 25 and yoke 23 rest one on the other. In the event of this movement, the contact support 26 is driven and presses the switching piece 29 onto the two fixed contacts 27, 28 via the spring 30. A conductive connection is thus produced.

FIG. 4 shows a switching module 31, which can likewise be installed in the housing base module 5 shown in FIG. 2, for forming a three-pole, two-phase controlled motor control device. No electronic switching element 18 is provided for the middle phase. Instead, a continuous current-carrying element 32, in the form of a copper rail here, lies in the middle chamber in the final mounting state.

FIGS. 5 to 9 show schematic illustrations of a selection of possible embodiments of the invention. The illustration in FIG. 5 corresponds to an embodiment of a three-phase controlled device, as described in FIGS. 2 and 3. FIG. 6 shows an embodiment which corresponds to the design of a two-phase controlled device with a continuous current-carrying element 32 which is described with reference to FIGS. 2 and 4.

FIG. 7 schematically depicts a four-pole, three-phase controlled device with a fourth pole which can be disconnected separately. For this purpose, a housing unit 3 which can be constructed in a modular manner is used, in which further chambers 33 can be attached to a housing base module 5, which has three chambers 9, depending on requirements. The chambers 33 which can be attached in this case preferably lie parallel to the chambers 9 which are already present. As an alternative to this embodiment of the housing unit 3, it is likewise possible to use a housing unit which is made up of the corresponding number of chambers in accordance with requirements, in place of a housing base module 5 with three chambers. Therefore, housing units with less than three chambers are also possible for example. To this end, the individual chambers are preferably connected to one another in a detachable manner.

The embodiment shown in FIG. 7 has an additional fourth pole, with this phase only being equipped with a mechanical contact system, for example a relay 34, which has to be switched separately. This enables upstream or downstream disconnection of an N-type conductor in a four-conductor network.

FIG. 8 shows a further embodiment of the invention with four chambers 9 for forming a two-phase controlled reversing starter. Finally, FIG. 9 shows a three-phase controlled reversing starter with poles which can be attached to the side. In this embodiment, a three-chamber housing base module 5 is extended by two further chambers 33.

FIGS. 5 to 9 schematically depict the central control unit 35 which serves to actuate the switching elements 18, 19.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. A motor control device, comprising:
  a number of power subunits, with at least one power subunit including an internal bridge and a transformer; and
  a housing to hold the power subunits, the housing including:
    a base module having a plurality of chambers electrically insulated from one another, the chambers being configured to hold interchangeably the internal bridge and a continuous current-carrying element, a cooling unit arranged outside of the base module on a first side of the base module, and a housing cover on the base module on a second side of the base module, wherein the base module includes a recess on a bottom portion thereof configured to receive interchangeably the transformer and the continuous current-carrying element, the recess being arranged outside of the plurality of chambers.

2. The motor control device as claimed in claim 1, wherein the power subunit includes an electronic switching element and an electromechanical switching element in the form of a bridge element.

3. The motor control device as claimed in claim 2, wherein a contact rail is associated with at least one power subunit and is arranged in the same chamber as the internal bridge.

4. The motor control device as claimed in claim 3, further comprising a central control unit, formed in accordance with the number of phases used, for driving the power subunits.

5. The motor control device as claimed in claim 4, wherein the chambers are arranged in an integral housing unit.

6. The motor control device as claimed in claim 5, wherein the number of chambers is matched to the functional requirements made of the motor control device in a variable manner.

7. The motor control device as claimed in claim 6, wherein the housing is made up of individual housing modules, with each housing module including at least one chamber.

8. The motor control device as claimed in claim 2, further comprising a central control unit, formed in accordance with the number of phases used, for driving the power subunits.

9. The motor control device as claimed in claim 2, wherein the chambers are arranged in an integral housing unit.

10. The motor control device as claimed in claim 2, wherein the number of chambers is matched to the functional requirements made of the motor control device in a variable manner.

11. The motor control device as claimed in claim 1, wherein a contact rail is associated with at least one power subunit and is arranged in the same chamber as the internal bridge.

12. The motor control device as claimed in claim 11, further comprising a central control unit, formed in accordance with the number of phases used, for driving the power subunits.

13. The motor control device as claimed in claim 11, wherein the chambers are arranged in an integral housing unit.

14. The motor control device as claimed in claim 11, wherein the number of chambers is matched to the functional requirements made of the motor control device in a variable manner.

15. The motor control device as claimed in claim 1, further comprising a central control unit, formed in accordance with the number of phases used, for driving the power subunits.

16. The motor control device as claimed in claim 15, wherein the chambers are arranged in an integral housing unit.

17. The motor control device as claimed in claim 15, wherein the number of chambers is matched to the functional requirements made of the motor control device in a variable manner.

18. The motor control device as claimed in claim 1, wherein the chambers are arranged in an integral housing unit.

19. The motor control device as claimed in claim 1, wherein the number of chambers is matched to the functional requirements made of the motor control device in a variable manner.

20. The motor control device as claimed in claim 18, wherein the housing is made up of individual housing modules, with each housing module including at least one chamber.

* * * * *